United States Patent [19]

Iwane

[11] Patent Number: 5,719,750

[45] Date of Patent: Feb. 17, 1998

[54] MULTILAYER PRINTED WIRING BOARD WITH PLURALITY OF GROUND LAYERS FORMING SEPARATE GROUND PLANES

[75] Inventor: Yasushi Iwane, Amagasaki, Japan

[73] Assignee: Mitsubishi Denki Kabushiki Kaisha, Tokyo, Japan

[21] Appl. No.: 676,103

[22] Filed: Jul. 2, 1996

Related U.S. Application Data

[63] Continuation of Ser. No. 391,246, Feb. 21, 1995, abandoned.

[30] Foreign Application Priority Data

Feb. 21, 1994 [JP] Japan ..................... 6-022811

[51] Int. Cl.⁶ ..................... H05K 1/11; H05K 7/02
[52] U.S. Cl. ..................... 361/794; 174/255; 333/181; 361/780; 361/782
[58] Field of Search ..................... 174/35 R, 35 C, 174/51, 255, 260, 261; 257/700, 653, 723, 724, 728; 333/12, 185, 204, 246, 238, 182, 184, 181; 361/748, 760, 777, 780, 782, 783, 792–794, 784, 790, 791, 803; 439/47, 68, 69, 88, 92, 109, 607; 428/901

[56] References Cited

U.S. PATENT DOCUMENTS

| | | | |
|---|---|---|---|
| 4,218,578 | 8/1980 | Olschewski et al. | 174/35 R |
| 4,855,537 | 8/1989 | Nakai et al. | 174/255 |
| 4,904,968 | 2/1990 | Theus | 333/246 |
| 4,984,132 | 1/1991 | Sakurai et al. | 361/794 |
| 5,023,753 | 6/1991 | Abe | 361/794 |
| 5,068,631 | 11/1991 | Vince | 361/794 |
| 5,363,280 | 11/1994 | Chobot et al. | 361/794 |
| 5,371,653 | 12/1994 | Kametani et al. | 361/794 |
| 5,376,759 | 12/1994 | Marx et al. | 174/255 |
| 5,475,606 | 12/1995 | Muyshondt et al. | 174/35 R |

FOREIGN PATENT DOCUMENTS

| | | | |
|---|---|---|---|
| 429695 | 6/1991 | European Pat. Off. | 174/35 C |
| 4-68598 | 3/1992 | Japan . | |
| 4-133394 | 5/1992 | Japan . | |

OTHER PUBLICATIONS

Machine Design Technical Brief 903 "Minimizing Noise in Digital PCB Layouts" No. 20 pp. 144 and 146 Sep. 1984.

*Primary Examiner*—Donald Sparks
*Attorney, Agent, or Firm*—Rothwell, Figg, Ernst & Kurz

[57] ABSTRACT

A printed board 10 is provided with two ground layers 3a, 3b. These ground layers 3a, 3b are electrically insulated inside the printed board. By connecting circuits with different characteristics (low frequency and high frequency, for example) with the different ground layers 3a, 3b, interference of these circuits caused due to a common ground can be minimized.

12 Claims, 8 Drawing Sheets

HIGH FREQUENCY RANGE

LOW FREQUENCY RANGE 5,719,750

MULTILAYER PRINTED WIRING BOARD WITH PLURALITY OF GROUND LAYERS FORMING SEPARATE GROUND PLANES

This is a continuation of application Ser. No. 08/391,246, filed Feb. 21, 1995 now abandoned.

FIELD OF THE INVENTION

The present invention relates to a multilayer printed wiring board with various components mounted on it and electrically connected by means of multilayer printed wiring, and particularly relates to the ground layer configuration of such a multilayer printed wiring board.

BACKGROUND OF THE INVENTION

Predetermined operations are often achieved using a printed wiring board having various electronic components mounted on it. It is known to use a multilayer printed wiring board with a plurality of printed wiring layers for circuits with a plurality of powers supply voltages, or for more complicated circuits.

FIG. 1 is a cross sectional view of a conventional multilayer printed wiring board. A printed board 10 is provided with four conductor layers 1, 2, 3 and 4 and insulation layers 5a, 5b and 5c. The conductor layer 1 is formed on the surface of the insulation layer 5a (surface of the printed board 10). The conductor layer 2 is formed between the insulation layers 5a, 5b, the conductor layer 3 between the insulation layers 5b, 5c, and the conductor layer 4 on the surface of the insulation layer 5c (back of the printed board 10). On the surface and back of the printed board 10, electronic components 6a to 6e are mounted. The printed board 10 is further provided with through holes 7b and 7c, which run through the board thickness and connect the conductor layers 1 to 4.

The conductor layers 1, 4 comprise wiring patterns for electrical connection among the electronic components 6a to 6e, the conductor layer 2 comprises power lines and wiring patterns, and the conductor layer 3 comprises ground line wiring.

The printed board 10 is electrically connected to the outside through pads at its ends. It processes the input signals with circuits comprising the electronic components 6a to 6e and outputs the processed signals. For circuit operation, a power line from an external power supply and a ground line are connected to the power and ground wirings on the printed board 10.

Such a multilayer printed wiring board enables complicated wiring circuits and allows sufficient space for grounding and power lines with smaller resistances.

A conventional multilayer printed board has, however, a substantially single ground layer. Even when a board has many ground layers, they are electrically connected by means of through holes and electrically serve as a single ground layer. The ground layer is usually fixed at a ground potential, and the multilayer printed wiring board works properly with a single ground layer.

However, the printed board 10 is often considered to have a plurality of circuits for different functions. For example, it may be divided into a circuit for processing high frequency signals and one for processing low frequency signals; it may be divided into a section for a large current and one for a small current.

In such cases, noise arising from operation of one circuit may be transmitted to the other circuit via the ground layer, which may result in a failure. For example, a large current in one circuit may cause fluctuations of the ground layer level, which may adversely affect the electric characteristics of the other circuit.

SUMMARY OF THE INVENTION

It is an object of the present invention to provide a multilayer printed wiring board with reduced interferences among circuits and excellent electrical characteristics so as to eliminate the above drawbacks.

The present invention is characterized in that a multilayer printed wiring board is provided with various components mounted on it and electrically connected by means of printed wiring of a plurality of layers, with a plurality of ground layers in the board, which are electrically insulated within the board.

According to the present invention, a plurality of ground layers are electrically insulated within the board. This enables connection of different circuits to different ground layers according to the circuit characteristics, while reducing interference between circuits. This prevents operation of one circuit from adversely affecting other circuits. For example, this configuration prevents a high frequency circuit operation from affecting the low frequency circuit or prevents digital circuit operation from affecting the high frequency circuit. In other words, this invention prevents conducted interferences caused by a common ground layer and prevents deterioration of characteristics due to interference of signals among electronic components.

This invention is also characterized by its connection at a point near the ground terminal for connecting ground layers in the board with an external ground line.

Even when the ground layers are connected at a point on the board, their reduced combination results in a similar effect. It is sufficient to provide a single ground terminal on the board in this case.

This invention is further characterized by its ground layer being electrically separated into a plurality of sections.

According to this invention, the ground layer is further divided into a plurality of layers so that diversified grounding can be selected.

This invention is characterized by a plurality of electrically insulated ground sections connected by means of a capacitor between them.

According to this invention, connection of a plurality of ground layers with a capacitor provides short circuit for high frequency and insulation for low frequency between the layers.

This invention is characterized by a plurality of ground sections electrically insulated and connected by means of an inductor between them.

According to the present invention, connection of a plurality of layers with an inductor provides insulation for high frequencies and short circuit for low frequencies between the layers.

It is preferable to apply the present invention to a printed board for a portable telephone. For example, use of different ground layer sections for high frequency and digital signals enables assured circuit operation. Further, it is preferable to separate the ground layer for a high frequency amplifier with a large current from the ground layers of other circuits using a capacitor or to connect the ground layer for a radio frequency (RF) section with that for an intermediate frequency (IF) section using an inductor.

EMBODIMENTS

Referring to the attached drawings, embodiments of the present invention will be described below.

Embodiment 1

Figure 2:
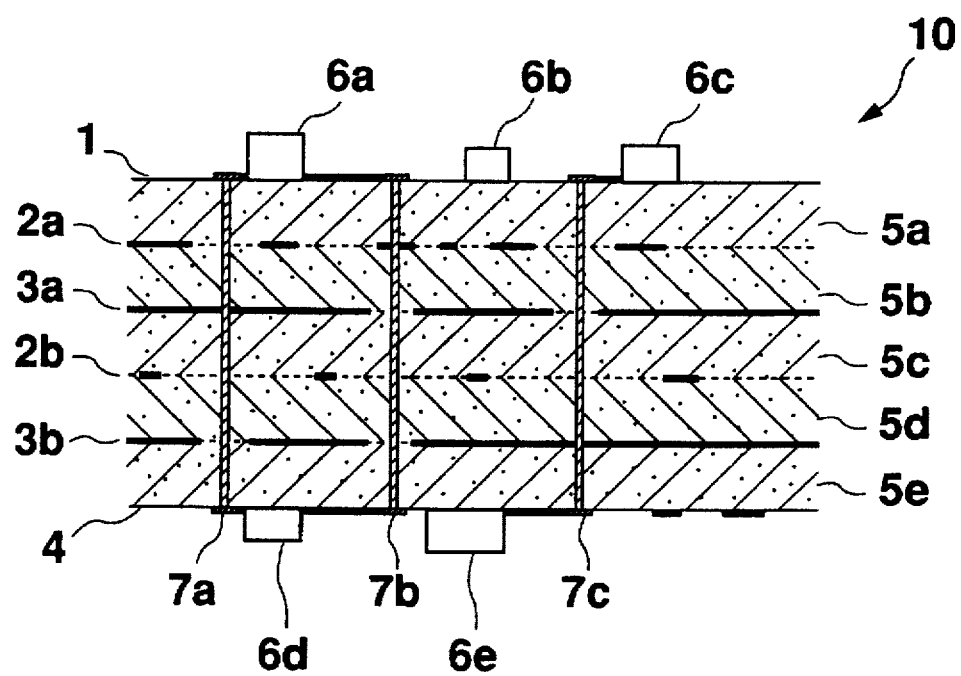
FIG. 2 is a cross sectional view of a multilayer printed wiring board according to a first embodiment of the present invention.

FIG. 2 is a cross sectional view of a multilayer printed wiring board according to a first embodiment of the present invention. A printed board 10 is provided with six conductor layers 1, 2a, 3a, 2b, 3b and 4, and five insulation layers 5a, 5b, 5c, 5d and 5e. The conductor layer 1 is formed on the surface of the insulation layer 5a (on the surface of the printed board 10) and the conductor layer 4 is positioned on the surface of the insulation layer 5e (on the back of the printed board 10). The conductor layer 4 is made of a thin copper film or other similar material, and the insulation layer 5 is made of ceramic, plastic or other similar material. The conductor layers 2a, 3a, 2b and 3b are positioned alternately with the insulation layers 5a, 5b, 5c, 5d and 5e. Further, the printed board 10 is provided with electronic components 6a to 6e on its surface and back. The printed board 10 is also provided with through holes 7a, 7b and 7c, which pass through the board and appropriately connect the conductor layers 1 to 4.

According to this embodiment, the conductor layers 3a, 3b constitute ground layers. These ground layers 3a, 3b are electrically insulated inside the printed board 10. In other words, the ground layers 3a, 3b are not connected by the through holes 7a to 7c.

Figure 3:
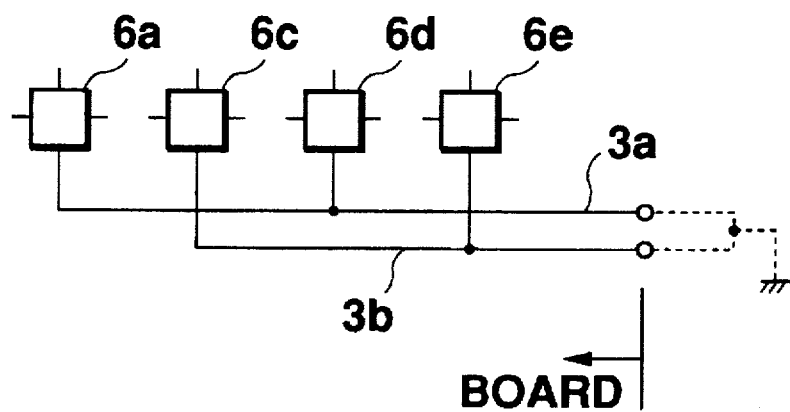
FIG. 3 is an explanatory view to show ground connection in the above embodiment.

FIG. 3 shows an equivalent circuit for this multilayer printed board. A high frequency circuit comprising the electronic components 6a, 6d is connected to the ground layer 3a and a digital circuit comprising the electronic components 6c, 6e is connected to the ground layer 3b. As shown in FIG. 2, grounding of the electronic components 6a, 6d is achieved by connecting to the ground layer 3a by the through hole 7a and the grounding of the electronic components 6c, 6E is achieved by connecting to the ground layer 3b by the through hole 7c. The ground layers 3a, 3b are provided with wide patterns as in conventional ones for reduced impedance.

The ground layers 3a, 3b are connected to an external grounding line from separate power/ground terminals.

Configuration of a Portable Telephone

Figure 4:
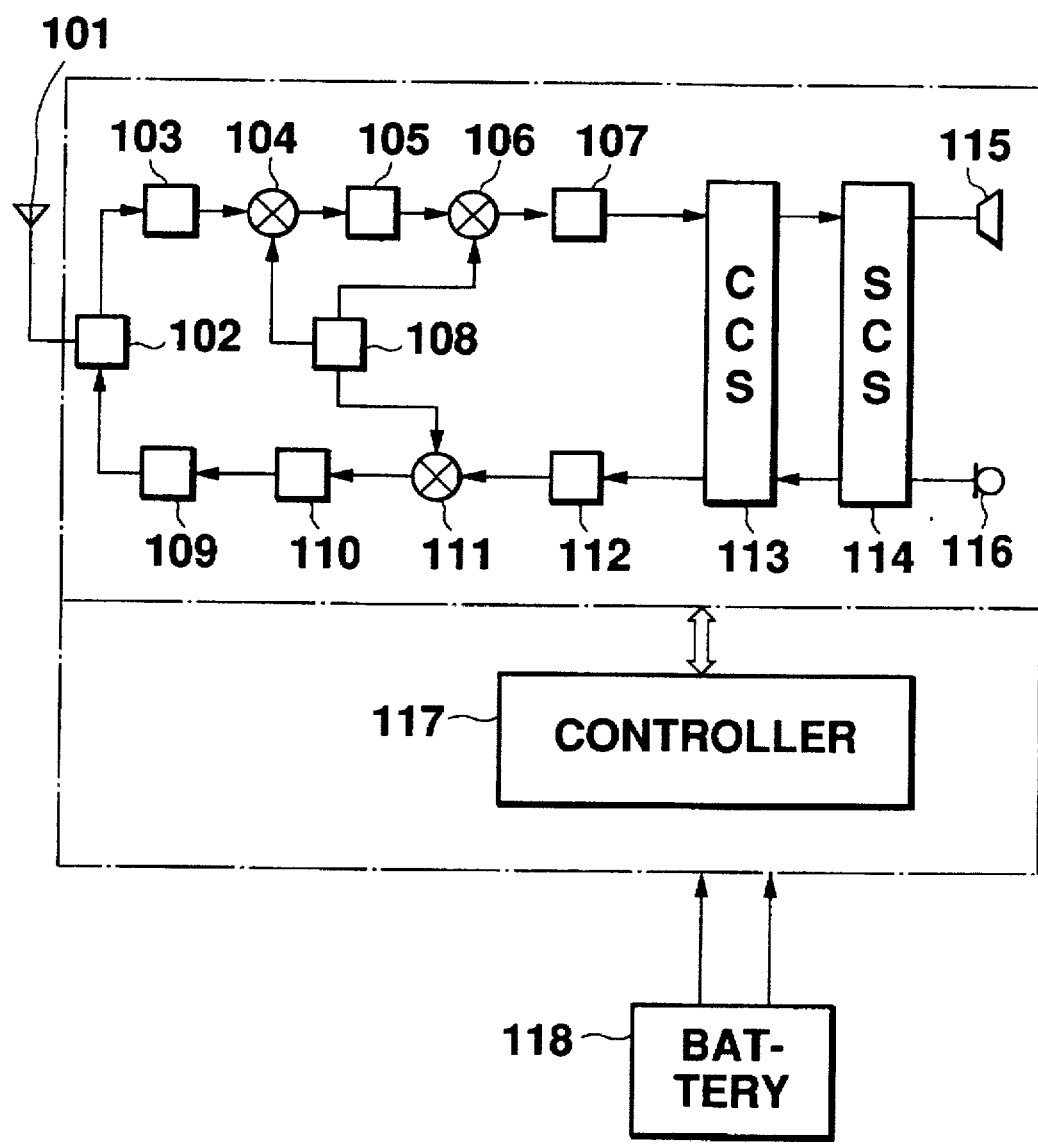
FIG. 4 is a block diagram to show the internal circuit configuration in a portable telephone.

The multilayer printed board of the present invention is preferably used in a portable telephone. FIG. 4 is a block diagram to show the configuration of a digital portable telephone. An antenna 101 is connected to a duplexer 102 where the received signals are extracted and the sent signals are fed to the antenna 101. The duplexer 102 is connected to a receiver RF amplifier 103, followed by a first mixer 104, a receiver IF section 105, a second mixer 106, and a demodulator 107.

The duplexer 102 is also connected to a modulator 112 via a transmitter RF power amplifier 109, a preamplifier 110 and a third mixer 111. A frequency synthesizer 108 generates signals of various frequencies necessary for the up/down conversion, of which frequency is determined by the allocated RF channel or the predetermined IF frequency. The signals generated in a frequency synthesizer 108 are provided to the first, second, and third mixers 104, 106, and 111.

The demodulator 107 and the modulator 112 are connected to a speaker 115 and a microphone 116 via a channel codec section (CCS) 113 and a speech codec section (SCS) 114. A controller 117 provides required signals to the above sections and processes call processing protocols. A battery 118 feeds power to all of these circuits.

A radio signal received at the antenna 101 are amplified by the receiver RF amplifier 103 and the frequency is lowered to the first intermediate frequency by the first mixer. Then, the signal is amplified again by the receiver IF amplifier 105 and converted to the second intermediate frequency by the second mixer 106 and then demodulated by the demodulator 107.

On the other hand, the sent signal modulated by the modulator 112 is converted to a signal of predetermined high frequency by the third mixer 111 and then amplified to a predetermined amplitude by the preamplifier 110 and the transmitter RF power amplifier 109. This is fed to the duplexer 102 and transmitted from the antenna 101.

The received signal demodulated by the demodulator 107 is firstly subjected to error correction code decoding at the channel codec section 113, and then to audio signal decoding at the speech codec section 114 for audible output from the speaker 115. On the other hand, the audio signal inputted from the microphone 116 is subjected to audio signal coding at the speech codec 114 and then error correction coding at the channel codec 113. The resulting signal is sent to the modulator 112. The output from the modulator 112 is transmitted from the antenna 101 as described above.

Figure 1:
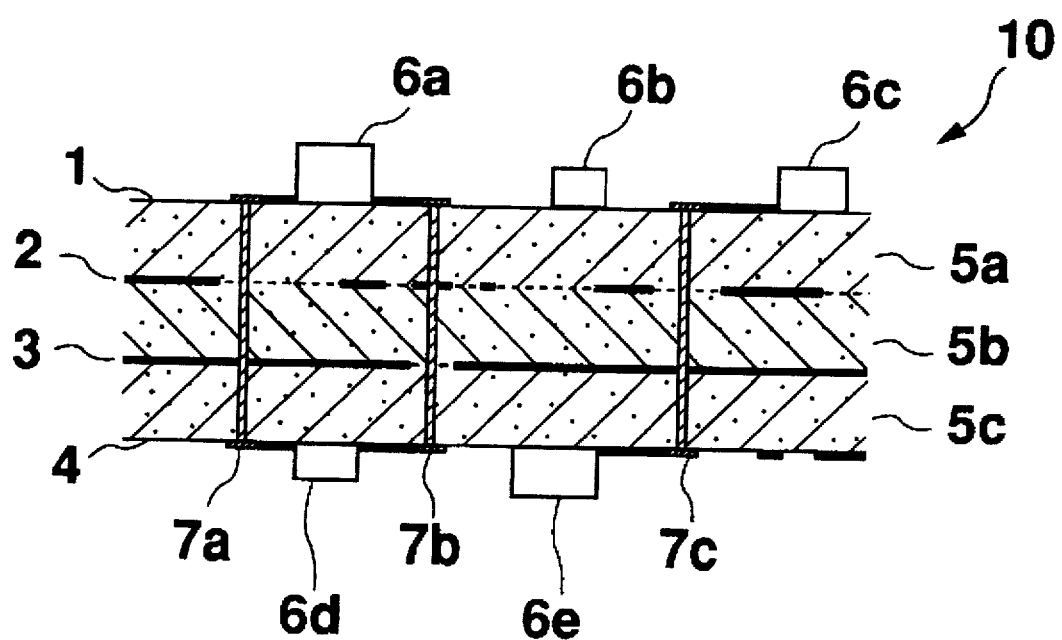
FIG. 1 is a cross sectional view of a conventional multilayer printed wiring board.

The circuit as above for a portable telephone is achieved by a multilayer printed wiring board as shown in FIG. 1. The circuit comprises three mixers 104, 106 and 111 and the signals have largely different frequencies before and after the mixers. The channel codec 113, the speech codec 114 and the controller 117 are usually designed as digital circuits and others are analog circuits. It is necessary to reduce the effect on the analog circuits caused by noise from digital circuits (clock, for example, is picked up by analogue circuit as noise).

Further, quite large electric currents flow in the transmitter RF power amplifier 109 compared to other circuits. At the start and end of signal transmission, in particular, power and ground potentials fluctuate due to switching of a large current. It is necessary to arrange the signal lines to minimize the effect of such fluctuation, to provide as low an impedance as possible at the ground and to reduce interference among circuits via common impedance at the ground.

Application of the Embodiment to a Portable Telephone

As described above, the present embodiment comprises the ground layers 3a, 3b connected to an external ground via different power and ground terminals.

The electronic components 6a and 6d for the high frequency circuit may correspond to the receiver RF amplifier 103 and the transmitter RF power amplifier 109. The electronic components 6c and 6d for the digital circuit may correspond to the channel codec 13 and the speech codec 14.

According to this embodiment, in particular, a plurality of power and ground terminals as above are connected to a single power supply (battery) at a single point outside of the board so as to reduce the common impedance. The ground layers 3a, 3b may be connected to different power supplies.

Thus, according to this embodiment, the ground layers 3a, 3b are electrically insulated within the board. This minimizes the electrical change in one of the ground layers affecting the other ground layers. By selecting a ground layer to be connected according to the characteristic of the circuit (electronic component, for example), electrical characteristics of the entire circuit can be made preferable.

Figure 5:
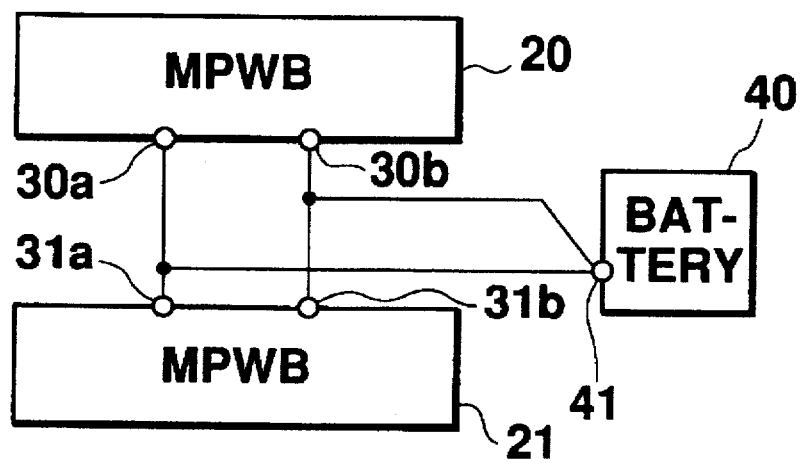
FIG. 5 is an explanatory view to show connection relationships for two multilayer printed wiring boards according to the above embodiment.

FIG. 5 shows an example of connection for a plurality of multilayer printed wiring boards according to the above embodiment. Multilayer printed wiring boards (MPWB) 20, 21 are provided with two ground layers each: 30a, 30b as well as 31a, 31b. The ground layers 30a, 31a are connected together, and further connected to a ground terminal 41 of a power supply (battery) 40. On the other hand, the ground layers 30b, 31b of the boards 20, 21 are commonly connected and further connected to the ground terminal 41 of the power supply 40.

Then, the ground lines for the high frequency circuit on the boards 20, 21 are respectively connected to the ground layers 30a, 31a and those for the digital circuit on the boards 20, 21 to the ground layers 30b, 31b. Thus, the high frequency circuit and the digital circuit are connected to different ground layers. This results in reduced interference via common impedance between the ground layers. In particular, single point connection of both ground layers at the ground terminal 41 of the power supply 40 achieves minimized interference between them. This configuration effectively prevents noise generated in digital circuit switching from being picked up by the high frequency circuit.

Embodiment 2

Figure 6:
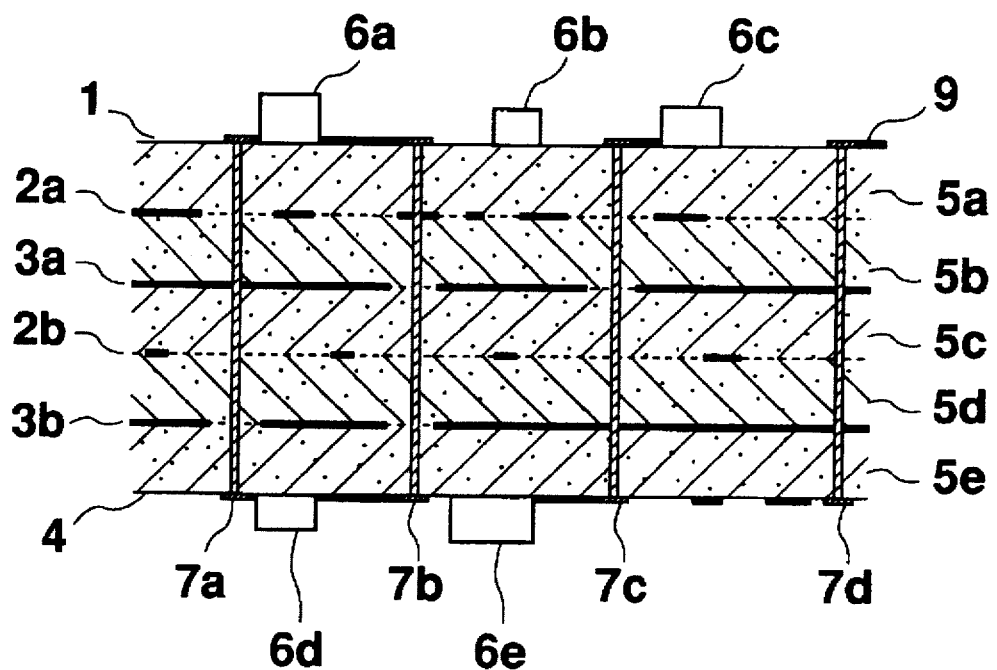
FIG. 6 is an explanatory view of a multilayer printed wiring board according to a second embodiment.
Figure 7:
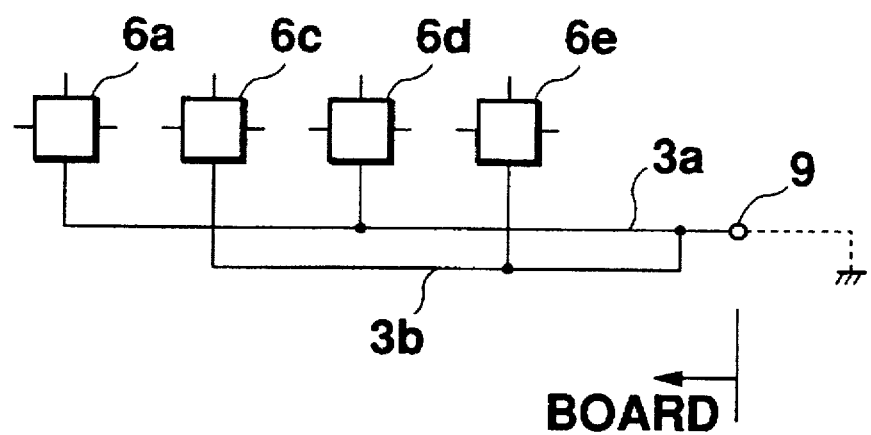
FIG. 7 is a schematic view to show ground connection in the above embodiment.

FIG. 6 shows a second embodiment of the present invention. In this embodiment, ground layers 3a, 3b are connected by a through hole 7d at a point in the board close to a ground terminal 9. FIG. 7 shows an equivalent circuit for this embodiment.

Even when the two ground layers 3a, 3b are connected at a single point in the board or, more specifically, at a point close to the terminal for connection with an external ground line, most parts of the ground layers 3a, 3b are electrically insulated. This results in relatively small interference between the ground layers 3a, 3b, so that the effects of noise can be minimized. According to this embodiment, the board may have only one power/ground terminal, which simplifies wiring.

Embodiment 3

Figure 8:
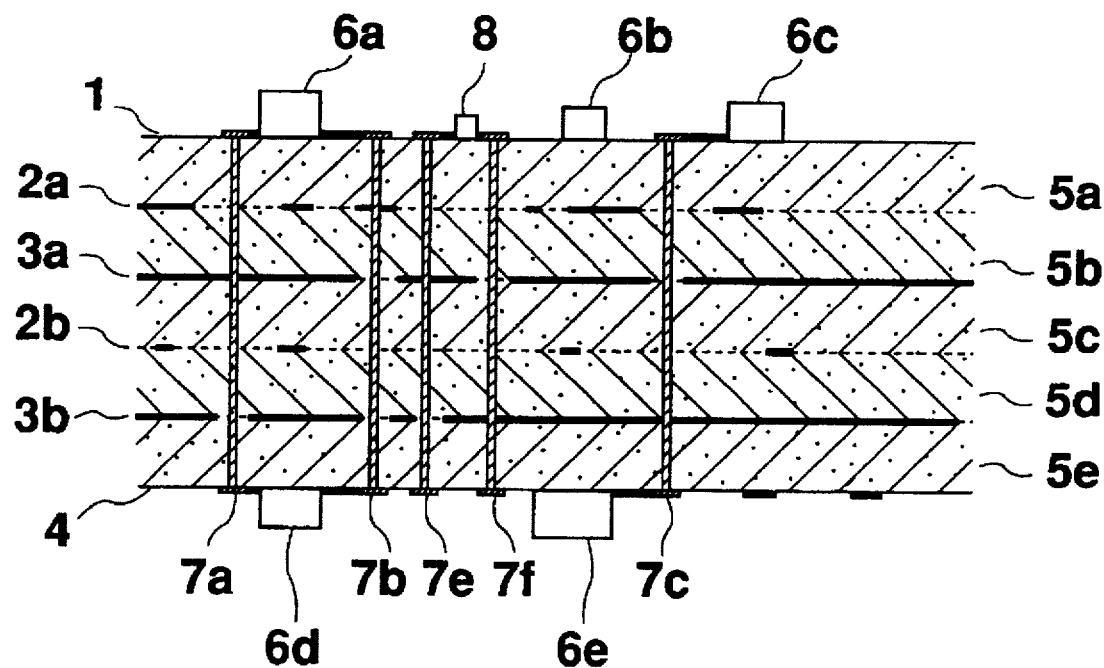
FIG. 8 is a cross sectional view of a multilayer printed wiring board to show a third embodiment.
Figure 9A:
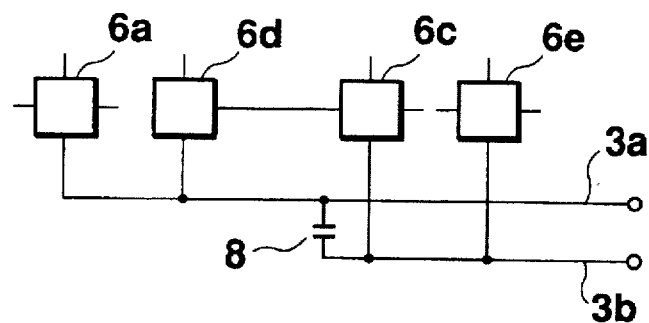
FIGS. 9A, 9B and 9C are schematic views to show ground connection, an equivalent circuit for high frequency and an equivalent circuit for low frequency, respectively, in the above embodiment.

FIG. 8 shows the configuration of a third embodiment according to the present invention. In the figure, through holes 7a, 7f are connected to the ground layers 3a, 3b respectively. These through holes 7e, 7f are connected via a capacitor 8. The equivalent circuit of FIG. 9A has its ground layers 3a, 3b connected by the capacitor 8.

Figure 9B:
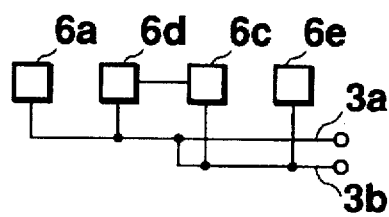
Figure 9C:
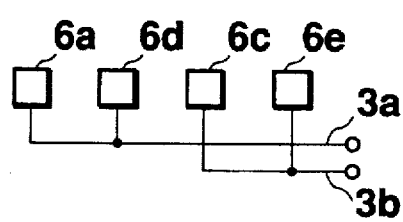

The capacitor 8 forms a short circuit for high frequency and an open circuit for direct current. The circuit of this embodiment provides a short circuit between the ground layers 3a, 3b in a high frequency range as shown in FIG. 9B and insulation between the ground layers 3a, 3b in a low frequency range as shown in FIG. 9C.

It is preferable to use such a printed board in a portable telephone as shown in FIG. 4. Specifically, the electronic component 6a is a frequency synthesizer 108, the electronic component 6d is a transmitter RF preamplifier 110 and the electronic components 6c, 6e are those included in a transmitter RF power amplifier 109.

As described above, the transmitter RF power amplifier 109 allows a larger current flow than other circuits. If its impedance with respect to ground is common to that of another circuit, the latter may pick up noise under the influence of the current in the power amplifier. At the start and end of signal transmission, in particular, the current changes abruptly and the frequency synthesizer 108 and the preamplifier 110 usually suffer from frequency fluctuation and spurious output. According to this embodiment, potential change at the ground layer 3b due to a large current change at the high frequency power amplifier 109 is prevented from being conducted to the ground layer 3a by the capacitor 8. Thus, the above drawbacks can be eliminated.

On the other hand, the high frequency signal component output from the preamplifier 110 is sent to the transmitter RF power amplifier 109. For this high frequency component, it is required to connect the grounds between the preamplifier 110 and the transmitter RF power amplifier 109 at a low impedance. According to this example, the ground layers 3a, 3b have a low impedance in a high frequency range and the characteristics of the above circuit can be strongly maintained.

Example 4

Figure 10:
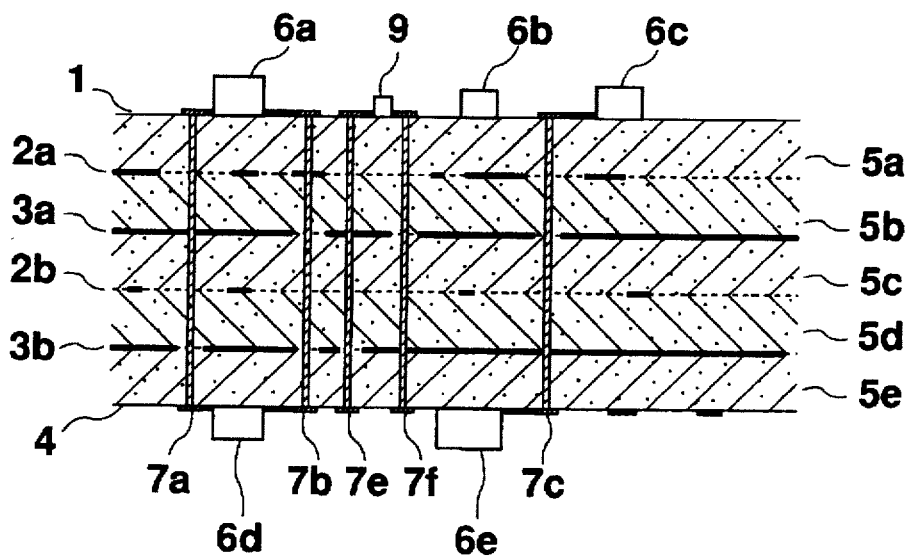
FIG. 10 is a cross sectional view of a multilayer printed wiring board according to a fourth embodiment.

FIG. 10 shows the configuration of a fourth example. In the figure, through holes 7e, 7f are connected with an inductor 9 having a sufficiently high impedance for high frequency signals. In this example, the electronic components 6a, 6d are included in the high frequency amplifier and the electronic components 6c, 6e are included in the intermediate frequency amplifier. For example, components in the receiver RF amplifier 103 are electronic components 6a, 6d and those in the receiver IF amplifier 105 are the electronic components 6c, 6e.

According to this example, the electronic components 6a, 6d at the RF section have their grounds connected to the ground layer 3a. The electronic components 6c, 6e at the IF section have their grounds connected to the ground layer 3b. The two ground layers 3a, 3b are connected with an inductor 9. Accordingly, the two ground layers 3a, 3b are effectively insulated with respect to high frequency and short-circuited for direct current. When the RF and IF sections are thus separated for the high frequency range, cross modulation and spurious output can be effectively prevented. On the other hand, for the low frequency component similar to direct current, the low impedance ground ensures stable circuit operation.

Figure 11A:
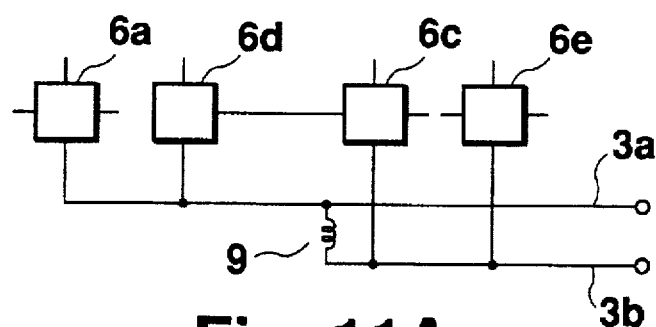
FIGS. 11A, 11B and 11C are schematic views to show ground connection, an equivalent circuit for high frequency and an equivalent circuit for low frequency, respectively, in the above embodiment.
Figure 11B:
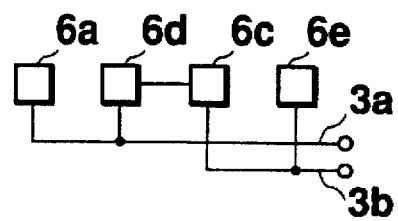
Figure 11C:
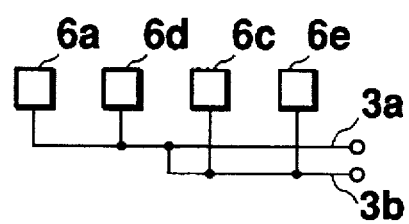

FIGS. 11A to 11C show equivalent circuits for the ground connection, high frequency and low frequency corresponding to the printed board of FIG. 10.

Example 5

Figure 12:
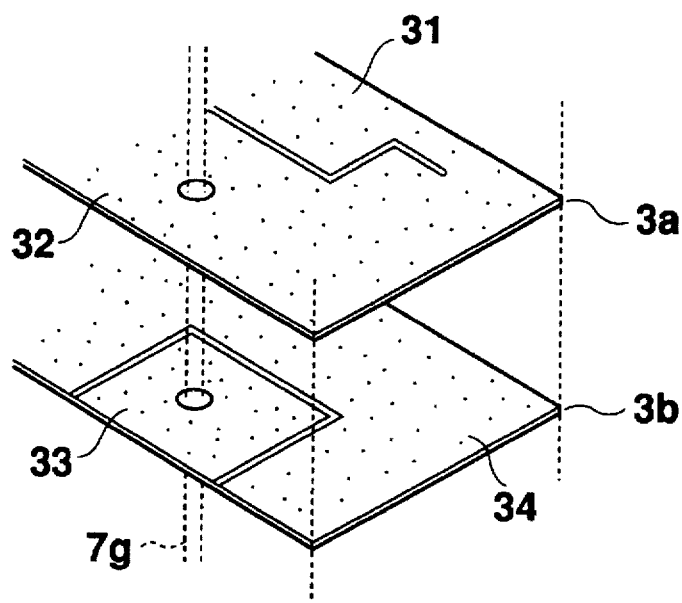
FIG. 12 is a schematic view to show the plane configuration in a ground layer according to a fifth embodiment.
Figure 13:
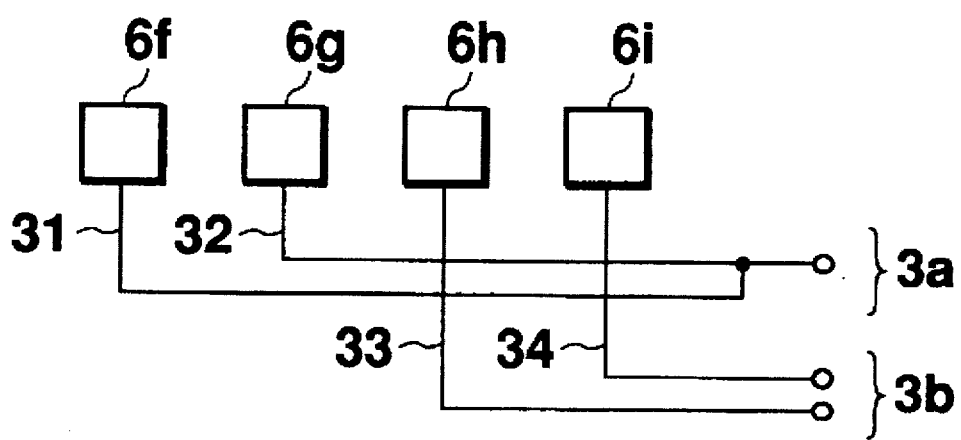
FIG. 13 is a schematic view to show ground connection in the above embodiment.

FIG. 12 shows ground layers of a multilayer printed wiring board according to a fifth example of the present invention. In this example, the ground layer 3a is divided into two ground planes 31, 32 in the layer. The ground layer 3b is also divided into two ground planes 33, 34 in the layer. FIG. 13 shows an equivalent circuit for this printed board. The grounds of the electronic components 6f to 6i are selectively connected to the ground planes 31 to 34 so that the interference via each ground is minimized. With this configuration, high and low frequency circuits may be separated or high frequency circuit and digital circuit may be separated. By providing two ground planes in a single layer, as in this example, the ground can be parted without increasing the total to a number which is more than required.

This example is quite effective when various circuits including RF, IF, transmitter power amplifier and digital circuits are mounted on one board, as in the case of portable telephones.

What is claimed is:

1. A multilayer printed wiring board, with various components mounted thereon being electrically connected by printed wiring on a plurality of layers comprising:

at least two separate ground layers positioned within the board in vertically spaced, horizontally overlapping relationship to each other and electrically insulated from each other for enabling connection of different components mounted on the board to different ones of said at least two separate ground layers, whereby the ground connections of said different components which are connected to separate ones of said ground layers are electrically insulated from each other.

2. A multilayer printed wiring board according to claim 1, wherein one of said two ground layers is a ground layer for high frequency circuits and the other is a ground layer for digital circuits.

3. A multilayer printed wiring board according to claim 1, wherein at least two ground layers are connected to the ground of a single power supply outside the board.

4. A multilayer printed wiring board according to claim 1, wherein the ground layers are electrically divided into a plurality of sections within the layers.

5. A multilayer printed wiring board device which has a plurality of multilayer printed wiring boards, each multilayer printed wiring board, with various components mounted thereon being electrically connected by printed wiring on a plurality of layers comprising at least two separate ground layers positioned within the board in vertically spaced, horizontally overlapping relationship to each other and electrically insulated from each other for enabling connection of different components mounted on each board to different ones of said at least two separate ground layers, whereby the ground connections of said different components which are connected to separate ones of said ground layers in each board are electrically insulated from each other, the at least two ground layers on one multilayer printed wiring board being separately connected to the at least two ground layers on another board.

6. A multilayer printed wiring board, with various components mounted thereon being electrically connected by printed wiring on a plurality of layers, comprising:

at least two ground layers positioned within the board in vertically spaced, horizontally overlapping relationship to each other and electrically insulated from each other for enabling connection of different components mounted on each board to different ones of said at least two separate ground layers, and a connecting member to connect the ground layers at a single point close to a ground terminal for connection with an external ground line.

7. A multilayer printed wiring board according to claim 6, wherein said connecting member is a through hole passing through the printed board to connect a plurality of ground layers.

8. A multilayer printed wiring board according to claim 6, wherein said ground layers are electrically divided into a plurality of sections within the layers.

9. A multilayer printed wiring board, with various components mounted thereon being electrically connected by printed wiring on a plurality of layers comprising:

separate ground layers in the printed wiring being divided into at least two ground sections positioned within the board in vertically spaced, horizontally overlapping relationship to each other and which are electrically insulated from each other and connected by a capacitor.

10. A multilayer printed wiring board according to claim 9, wherein a ground layer of a high frequency power amplifier is connected with a ground layer of another circuit via a capacitor.

11. A multilayer printed wiring board, with various components mounted thereon being electrically connected by printed wiring on a plurality of layers comprising:

separate ground layers in the printed wiring being divided into at least two ground sections positioned within the board in vertically spaced, horizontally overlapping relationship to each other and which are electrically insulated from each other and connected by an inductor.

12. A multilayer printed wiring board according to claim 11, wherein one of the ground layers connected by means of the inductor serves as a ground layer for a radio frequency (RF) section and the other as a ground layer for an intermediate frequency (IF) section.

* * * * *